(12) United States Patent  
Oh et al.

(10) Patent No.: US 8,519,757 B2
(45) Date of Patent: Aug. 27, 2013

(54) APPARATUS AND METHOD FOR FREQUENCY CALIBRATION IN FREQUENCY SYNTHESIZER

(75) Inventors: Sechang Oh, Seongnam (KR); Kyoohyun Lim, Seongnam (KR); Kisub Kang, Seongnam (KR)

(73) Assignee: FCI Inc., Gyeonggi-do (KR)

( * ) Notice: Subject to any disclaimer, the term of this patent is extended or adjusted under 35 U.S.C. 154(b) by 198 days.

(21) Appl. No.: 13/158,413

(22) Filed: Jun. 11, 2011

(65) Prior Publication Data

US 2011/0304367 A1 Dec. 15, 2011

(30) Foreign Application Priority Data

Jun. 11, 2010 (KR) .................. 10-2010-0055487

(51) Int. Cl.
*H03L 7/06* (2006.01)
(52) U.S. Cl.
USPC ........................................ 327/157; 327/148
(58) Field of Classification Search
USPC .................................................. 327/147, 156
See application file for complete search history.

(56) References Cited

U.S. PATENT DOCUMENTS

| 2009/0167385 | A1* | 7/2009 | Lin et al. ........................ 327/157 |
| 2009/0243677 | A1* | 10/2009 | Becker et al. .................. 327/158 |
| 2010/0141310 | A1* | 6/2010 | Yu et al. ......................... 327/156 |
| 2011/0187425 | A1* | 8/2011 | Mika et al. ..................... 327/157 |
| 2011/0193600 | A1* | 8/2011 | Isik ................................. 327/156 |
| 2011/0221487 | A1* | 9/2011 | Lesso ............................. 327/147 |
| 2011/0221489 | A1* | 9/2011 | Tarng et al. .................... 327/156 |
| 2011/0260763 | A1* | 10/2011 | Wang ............................. 327/157 |
| 2011/0298504 | A1* | 12/2011 | Becker et al. .................. 327/149 |
| 2011/0304367 | A1* | 12/2011 | Oh et al. ........................ 327/157 |
| 2011/0316595 | A1* | 12/2011 | Bolton ........................... 327/156 |
| 2012/0013375 | A1* | 1/2012 | Kuramochi .................... 327/156 |
| 2012/0249195 | A1* | 10/2012 | Guo et al. ...................... 327/156 |
| 2012/0319747 | A1* | 12/2012 | Namdar-Mehdiabadi et al. ............................. 327/149 |
| 2013/0009681 | A1* | 1/2013 | Endo et al. .................... 327/156 |

* cited by examiner

*Primary Examiner* — Adam Houston (57) ABSTRACT

An apparatus and a method for frequency calibration in a frequency synthesizer are disclosed. The present invention includes an up/down processor. The up/down processor is utilized for outputting one of a GND voltage and a VDD voltage to a voltage-controlled oscillator via a loop filter in an open loop status, or outputting one of a step-up voltage and a step-down voltage in accordance with a phase difference to the voltage-controlled oscillator via the loop filter in a close loop status. When the up/down processor outputs one of the GND voltage and the VDD voltage in the open loop status, a memory bank selector compares frequencies for selecting a value of a memory bank and then adds an offset to the value of the memory bank so as to determine a final value of a VCO memory bank in the phase locked loop.

6 Claims, 10 Drawing Sheets

APPARATUS AND METHOD FOR FREQUENCY CALIBRATION IN FREQUENCY SYNTHESIZER

BACKGROUND OF THE INVENTION

1. Field of the Invention

The present invention generally relates to a frequency synthesizer and a control method thereof having a function for calibrating an oscillation frequency, and more particularly, to an apparatus for frequency calibration in a frequency synthesizer and a control method thereof. The apparatus for frequency calibration in the frequency synthesizer and the control method thereof are utilized in a phase locked loop and remove a loop switch which is utilized for selecting a Vref voltage to be an input in an open loop status. In the apparatus and the method thereof, a charge pump directly outputs a GND voltage or a VDD voltage in the open loop status to decrease phase noise. When a memory bank which corresponds to a target frequency is selected, a memory bank offset compensation is performed according to a GND mode or a VDD mode.

2. Description of Prior Art

In a general situation, a phase locked loop (PLL) compares a phase of an input frequency with a phase of a feedback frequency, and then a locking frequency is controlled by a step-up/step-down charging method.

Figure 1:
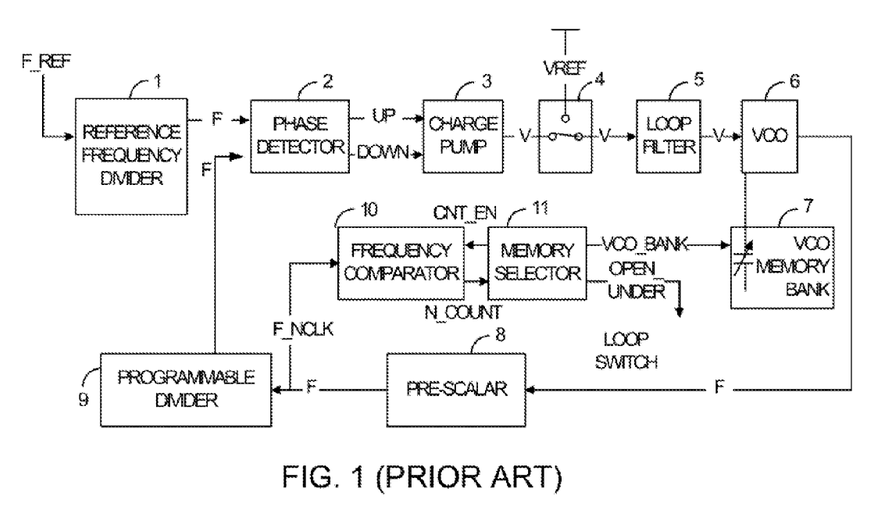
FIG. 1 shows a controlling circuit diagram of a conventional PLL.

FIG. 1 shows a controlling circuit diagram of a conventional PLL. As shown in FIG. 1, the PLL comprises a reference frequency divider 1 for adjusting an input frequency, a phase detector 2 for comparing a phase of the input frequency with a phase of a feedback frequency, a charge pump 3 for generating a step-up/step-down voltage in accordance with the phase difference detected by the phase detector 2, a loop switch 4 for selecting either the step-up/step-down voltage in a close loop status or a Vref voltage in an open loop status, a loop filter 5 for removing noise resulting from the voltage which is selected by the loop switch 4, a voltage-controlled oscillator (VCO) 6 for controlling an oscillation frequency according to an output voltage of the loop filter 5, a VCO memory bank 7 for setting the oscillation frequency of the VCO 6, a pre-scaler 8 for dividing the oscillation frequency which is oscillated by an integer factor of the VCO 6, a programmable frequency divider 9 for dividing the frequency which is divided by the pre-scalar and oscillated to be the target frequency in the VCO 6 and a calculation value and feeding the calculation value back to the phase detector 2, a frequency comparator 10 for comparing the frequency outputting from the pre-scaler 8 with the target frequency, and a memory bank selector 11 for selecting the VCO memory bank 7.

When the conventional PLL (PLL circuits) as mentioned above is calibrated in the initial open loop status, the Vref voltage (for example, VDD/2) is inputted from the loop switch 4 to the VCO 6 via the loop filter 5, and the output frequency of the VCO 6 is proportionally oscillated by the Vref voltage. Then, after the frequency comparator 10 compares the output frequency with the target frequency, the memory bank selector 11 selects a memory bank that is closest to a compared result, whereby the programmable frequency divider 9 can divide the frequency as the calculation value which can be oscillated as the target frequency, and the calculation value is fed back to the phase detector 2.

The VCO memory bank 7 can be utilized and disposed in a capacitor array of the VCO 6 or in a PLL system without a structure of a memory bank. To have a broader band and a low phase noise, it's better for the VCO 6 of the PLL which is utilized in a wireless transceiver system or in a general situation to have a small gain value (Kvco). The VCO 6 comprises the capacitor array to form a structure of a memory bank so as to decrease the gain value (Kvco).

The phase detector 2 detects the phase difference between the output frequency of the reference frequency divider 1 and the output frequency of the programmable divider 9, and then the phase detector 2 generates the step-up/step-down voltage (Vc) to the charge pump 3 according to the phase difference. The output of the charge pump 3 is selected by the charge pump 3 and inputted to the VCO 6 via the loop filter 5 to be a control voltage. The VCO 6 controls the oscillation frequency proportional to the control voltage (Vc) which is corresponding to the phase difference. By doing so, the oscillation frequency is controlled according to the phase difference to select the final memory bank for implementing a frequency locked function.

When a new frequency is locked in the conventional PLL, the VCO 6 performs the oscillation operation after the loop switch 4 selects the Vref voltage to fix the control voltage. The memory bank selector selects the required memory bank to implement PLL lock in the close loop status. However, the conventional PLL comprises the loop switch 4, and the control voltage is inputted to the VCO 6 by the loop switch 4. Accordingly, a problem of phase noise occurs because the loop switch 4 utilizes COMS switches. Furthermore, there also exists a disadvantage of requiring a circuit for generating the Verf voltage.

SUMMARY OF THE INVENTION

To solve the above-mentioned problem of using the loop switch in the conventional PLL, an objective of the present invention is to provide an apparatus for frequency calibration in a frequency synthesizer and a control method thereof. The apparatus and the control method comprise an up/down processor and removes the loop switch which generates noise. In an open loop status, a charge pump is controlled to output a GND voltage or a VDD voltage. In a close loop status, the charge pump is controlled to output a step-up voltage or a step-down voltage which varies with a phase difference. Therefore, a problem of phase noise can be prevented, and the voltage generating circuit for generating the Vref voltage is not required in the open loop status.

Furthermore, the present invention selects a value of a memory bank when the GND voltage or the VDD voltage is inputted to a VCO, Then, an offset is added to the value of the memory bank so as to determine a final value of a VCO memory bank.

Since the loop switch function in the conventional PLL is to select a voltage, the voltage is affected by noise which is generated by CMOS elements of the loop switch. However, the up/down processor of the present invention processes digital signals, and thus the up/down processor is required to distinguish only 0 and 1. That is, the digital signals are not affected by noise which is generated by the up/down processor.

To reach the above-mentioned objective, in the apparatus for frequency calibration in the frequency synthesizer, a phase detector detects a phase difference between a phase of an input frequency and a phase of a feedback frequency which is fed back by a programmable divider. A charge pump generates and outputs one of a step-up voltage and a step-down voltage to a voltage-controlled oscillator via a loop filter. A frequency comparator compares the output frequency with a target frequency while the programmable divider feeds an output frequency of the voltage-controlled oscillator back to the phase detector. A memory bank selector selects a voltage-controlled oscillator memory bank of the voltage-controlled oscillator to reach the target frequency. The up/down processor is disposed between the phase detector and the charge pump. The up/down processor outputs one of a GND voltage and a VDD voltage in an open loop status, and outputs one of the step-up voltage and the step-down voltage in a close loop status according to the phase difference to a VCO via a loop filter. A value of the memory bank which is selected by the memory bank selector in the open loop status is added to an offset to determine a final value of the VCO memory bank.

Furthermore, the method for frequency calibration in the frequency synthesizer, a GND voltage or a VDD voltage being inputted to a voltage-controlled oscillator in an open loop status, a voltage-controlled oscillator memory bank of a voltage-controlled oscillator being selected after an output frequency of the voltage-controlled oscillator is compared with a target frequency, the method comprises the following steps.

In an open loop calibration stage, the output frequency of the VCO is compared with the target frequency, the voltage-controlled oscillator memory bank of the voltage-controlled oscillator is updated, and a memory bank whose frequency is close to the target frequency is selected.

In an offset compensation stage, the voltage-controlled oscillator memory bank which is selected in the open loop calibration stage is compensated with an offset.

In a memory bank reversal offset compensation stage, the current frequency which is updated in the offset compensating stage is compared with a previous frequency to determine whether the memory bank reversal occurs. When the memory bank reversal occurs, the memory bank is updated until finding the memory bank which has the same frequency as the frequency of the memory bank where the memory bank reversal occurs. After the memory bank reversal offset is compensated, returning to the offset compensation stage.

As mentioned-above, the frequency synthesizer of the present invention removes the loop switch which selects the open loop or the close loop, and thus the problem of phase noise can be decreased. A control voltage which uses the GND voltage or the VDD voltage in the open loop status is compensated with the offset, so as to obtain the same result of using the Vref voltage. In addition, the present invention further compensates for stray capacitance when a memory bank reversal occurs, whereby the frequency locked function can be implemented faster.

DETAILED DESCRIPTION OF THE INVENTION

Figure 2:
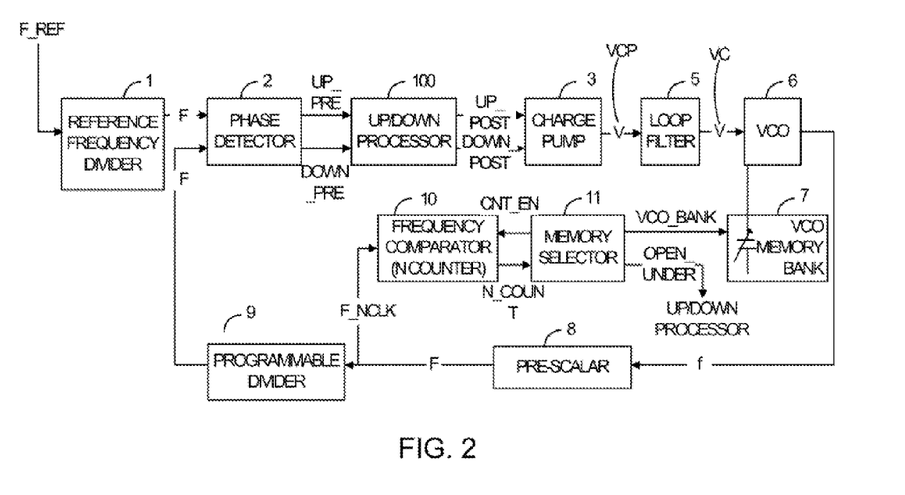
FIG. 2 depicts a phase locked loop (PLL) according to the present invention.

Please refer to FIG. 2, which depicts a phase locked loop (PLL) according to the present invention. A frequency synthesizer as shown in FIG. 1 comprises a reference frequency divider 1 for adjusting an input frequency, a phase detector 2 for comparing a phase of the input frequency with a phase of a feedback frequency, a charge pump 3 for generating one of a step-up voltage and a step-down voltage in accordance with a phase difference of the phase detector 2, a loop filter 5 for removing noise of the step-up voltage and the step-down voltage, a voltage-controlled oscillator (VCO) 6 for controlling an oscillation frequency in accordance with an output voltage from the loop filter 5, a VCO memory bank 7 for setting the oscillation frequency of the VCO 6, a pre-scalar 8 for dividing the oscillation frequency by an integer factor to decrease the oscillation frequency, and a programmable divider 9 for dividing the oscillation frequency from the pre-scalar 8 to be a reference frequency and feeding the reference frequency back to the phase detector 2.

An apparatus for frequency calibration in the frequency synthesizer comprises an up/down processor 100, a frequency comparator (or called N counter) 10, and a memory bank selector 11. According to a control voltage which is utilized for selecting an open loop status or a close loop status, the up/down processor 100 controls the charge pump 3 to output one of a GND voltage and a VDD voltage in the open loop status, and to output one of the step-up voltage and the step-down voltage in the close loop status according to the phase difference of the phase detector 2. The frequency comparator 10 compares a current frequency with a target frequency according to the oscillation frequency which is outputted by the pre-scalar 8. The memory bank selector 11 selects a memory bank in the VCO memory bank 7, wherein the memory bank generates a frequency close to the target frequency.

After the memory bank which is determined by the memory bank selector 11 is compensated in the open loop status according to an offset value which is set in the GND mode or the VDD mode, the compensated memory bank serves as a final VCO memory bank.

Figure 3:
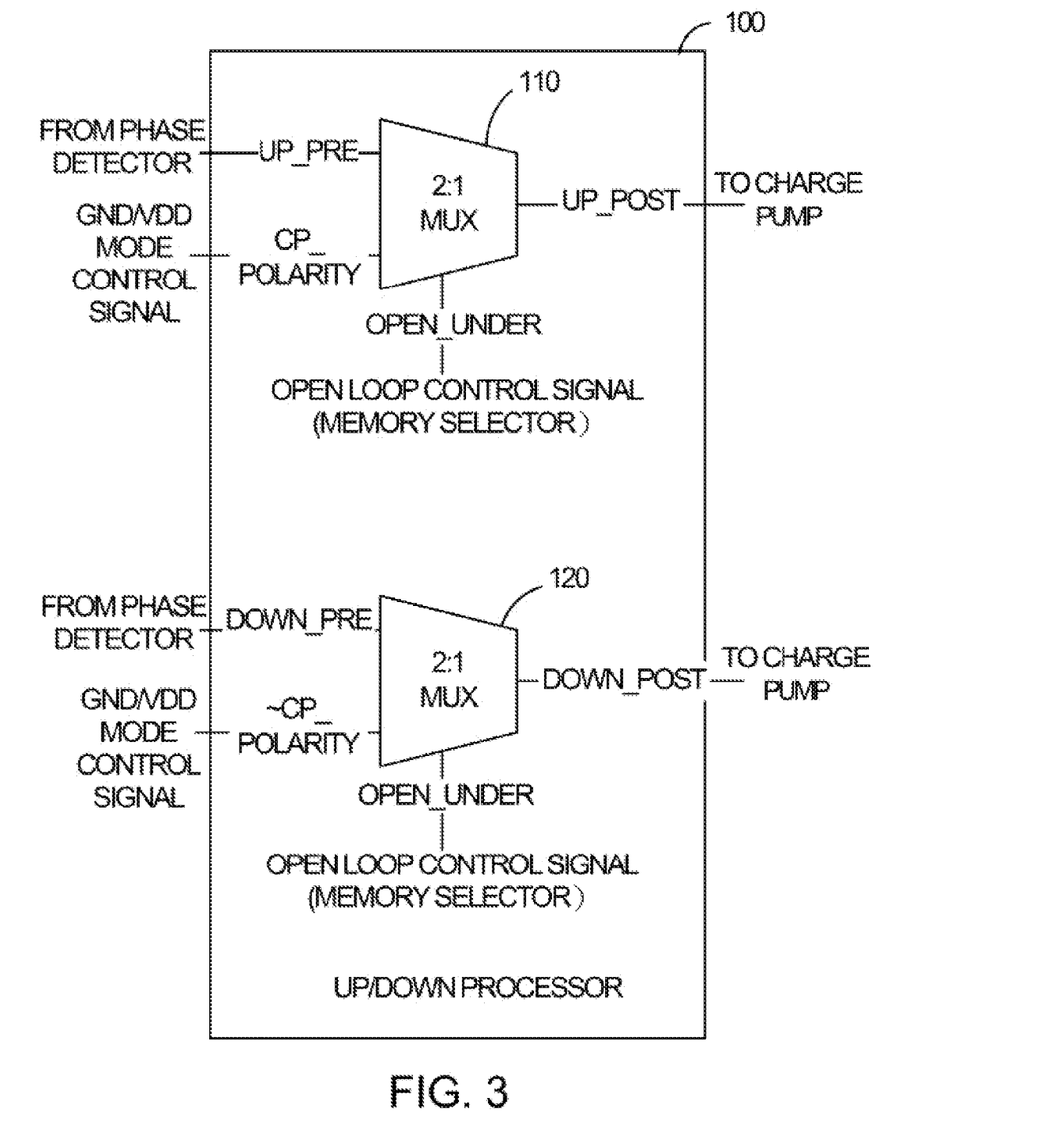
FIG. 3 illustrates components of the up/down processor.

Please refer to FIG. 3, which illustrates components of the up/down processor 100. As shown in FIG. 3, the components of the up/down processor 100 comprises a first multiplexer (2:1 MUX) 110 and a second multiplexer (2:1 MUX) 120. According to an open loop control signal (OPEN_UNDER) from the memory bank selector, the first multiplexer (2:1 MUX) 110 selects either a GND/VDD mode control signal (CO_POLARITY) in the open loop status or an up control signal (UP_PRE) which is varied with the phase difference of the phase detector 2, and then outputs an up control signal (UP_POST) to the charge pump 3. According to the open loop control signal (OPEN_UNDER) from the memory bank selector, the second multiplexer (2:1 MUX) 120 selects either the GND/VDD mode control signal (CO_POLARITY) in the open loop status or a down control signal (DOWN_PRE) which is varied with the phase difference of the phase detector 2, and then outputs an down control signal (DOWN_POST) to the charge pump 3. When the mode control signal (CP_POLARITY) is inputted to the charge pump 3, the GND voltage or the VDD voltage is selected to be the control voltage of the VCO 6 according to the corresponding to the mode control signal.

In the phase locked loop of the present invention, the loop switch 4 in the conventional phase locked loop as shown in FIG. 1 is removed and the up/down processor 100 is utilized for substituting for the loop switch 4.

As shown in FIG. 3, the up/down processor 100 comprises the first and second multiplexers 110, 120 for selecting one of the up control signal and the down control signal in accordance with the mode control signal (CP_POLARITY) or the phase difference of the phase detector 2. The first and second multiplexers 110, 120 select the mode control signal (CP_POLARITY) in the open loop status or the up/down control signals in the close loop status in accordance with the open loop control signal. The mode control signal (CP_POLARITY) is a value which is set in advance according to characteristics of terminal or band. For example, when the mode control signal (CP_POLARITY) is 0, a Vcp GND mode is set; when the mode control signal (CP_POLARITY) is 1, a Vcp VDD mode is set. Therefore, according to the mode control signal (CP_POLARITY), the charge pump 3 outputs the GND voltage or the VDD voltage to be a control voltage in the open loop status, that is, to be the control voltage of the VCO 6.

Accordingly, in the open loop status of the present invention, the GND voltage or the VDD voltage is utilized to be the control voltage and outputted from the charge pump 3, whereby the VCO 6 performs the oscillation operation. Meanwhile, the VCO 6 is electrically coupled to the VCO memory bank 7 which is capable of operating in a broad band having low phase noise, and the VCO 6 selects the VCO memory bank 7 for performing the frequency locked function.

The VCO memory bank selector 11 selects a memory bank according to a compared result of the frequency comparator 10. As an exemplary, the VCO memory bank selector 11 may be an N counter. The N counter counts the current frequency and compares the current frequency with the target frequency, so as to select a memory bank having a frequency that is closest to or the same as the target frequency.

However, since a design capacity of the VCO memory bank 7 may be different from a practical capacity of the VCO memory bank 7, the memory bank reversal may occur. Therefore, a selection of a memory bank is required to be controlled.

Figure 4:
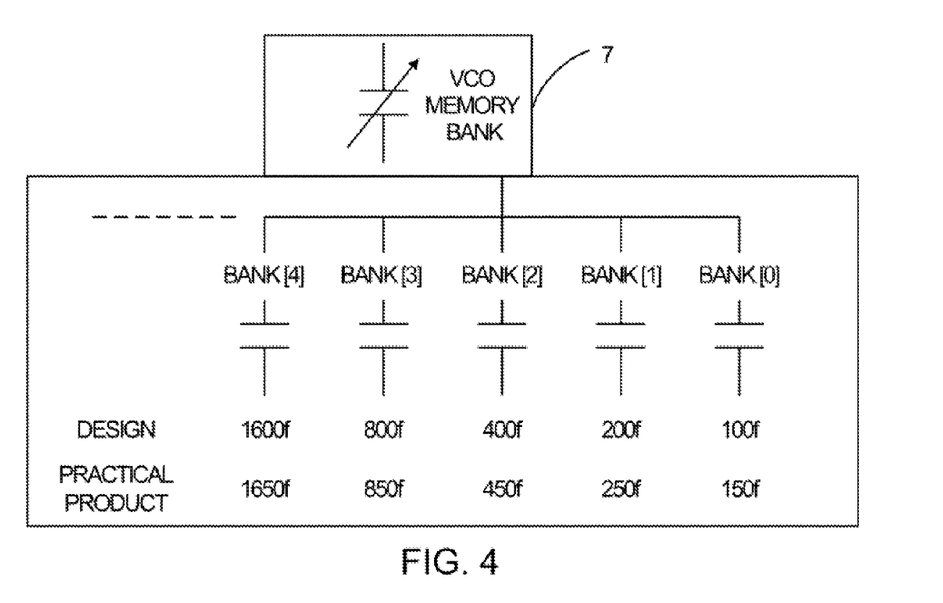
FIG. 4 illustrates a general VCO memory bank.

Please refer to FIG. 4, which illustrates a general VCO memory bank. As shown in FIG. 4, if the VCO memory bank is sequentially designed as Bank[0]=100 f, Bank[1]=200 f, Bank[2]=400 f, Bank[3]=800 f, Bank[4]=1600 f, . . . , a practical product may be Bank[0]=150 f, Bank[1]=250 f, Bank[2]=450 f, Bank[3]=850 f, Bank[4]=1650 f, . . . and so on. The design capacity and the practical capacity may be different.

Although a certain degree of stray capacitance can be estimated by a design model, there still exists an apparently difference between the design model and the practical product. In a general situation, when the memory banks are increased, the stray capacitance is increased as well. However, the stray capacitance which can be estimated is limited, and thus the memory bank reversal where the memory banks are increased but the stray capacitance is decreased. Since the memory bank reversal exists, it is difficult to select the memory bank.

The memory bank selector selects the memory bank whose frequency is close to the target frequency by comparing the target frequency with the current frequency. A method to select the memory bank is implemented by a linear search or a binary search. The present invention utilizes the same method as well.

Figure 5:
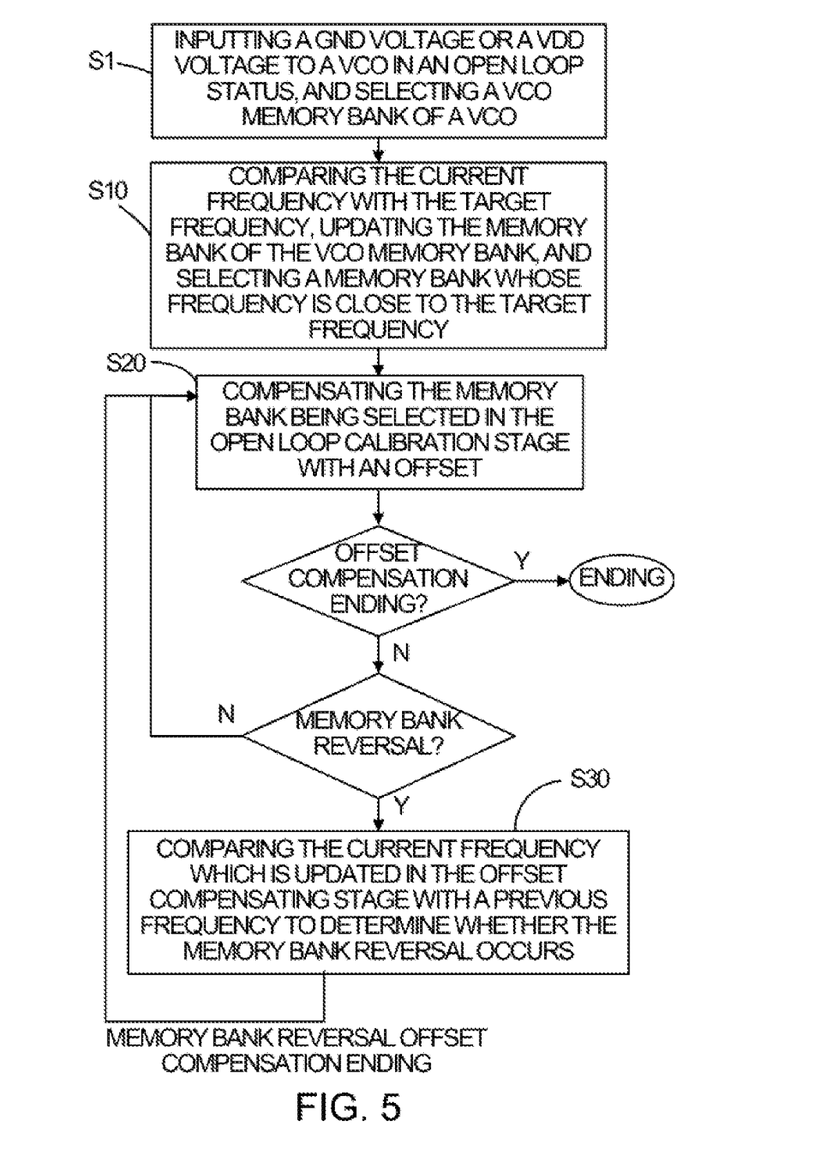
FIG. 5 illustrates a flow chart of a method for selecting the memory bank.

Please refer to FIG. 5, which illustrates a flow chart of a method for selecting the memory bank. As shown in FIG. 5, a method for frequency calibration in the frequency synthesizer comprises the following steps. In the method, the current frequency which is outputted by the VCO is compared with the target frequency so as to select the VCO memory bank.

In a loop control stage S1, the GND voltage or the VDD voltage is inputted to be the control voltage of the VCO in the open loop status, and the up control voltage or the down control voltage is inputted to be the control voltage of the VCO in the close loop status.

In an open loop calibration stage S10, the current frequency which is outputted by the VCO is compared with the target frequency, and the VCO memory bank of the VCO is updated, whereby the memory bank whose frequency is close to the target frequency can be selected.

In an offset compensation stage S30, the memory bank which is selected in the open loop calibration stage S20 is compensated with an offset.

In a memory bank reversal offset compensation stage S40, the current frequency is compared with the previous frequency so as to determine whether the memory bank reversal occurs. When the memory bank reversal occurs, the memory bank is updated until finding a next memory bank having the same frequency as the frequency of the memory bank where the memory bank reversal occurs. Then, after the memory bank reversal offset is compensated, returning to the offset compensation stage S30.

In the open loop calibration stage S10, the GND voltage or the VDD voltage which is outputted by the up/down processor 100 is inputted to the VCO 6 in the open loop status. This is the same process as the process of selecting the controlling voltage in FIG. 2.

Figure 6:
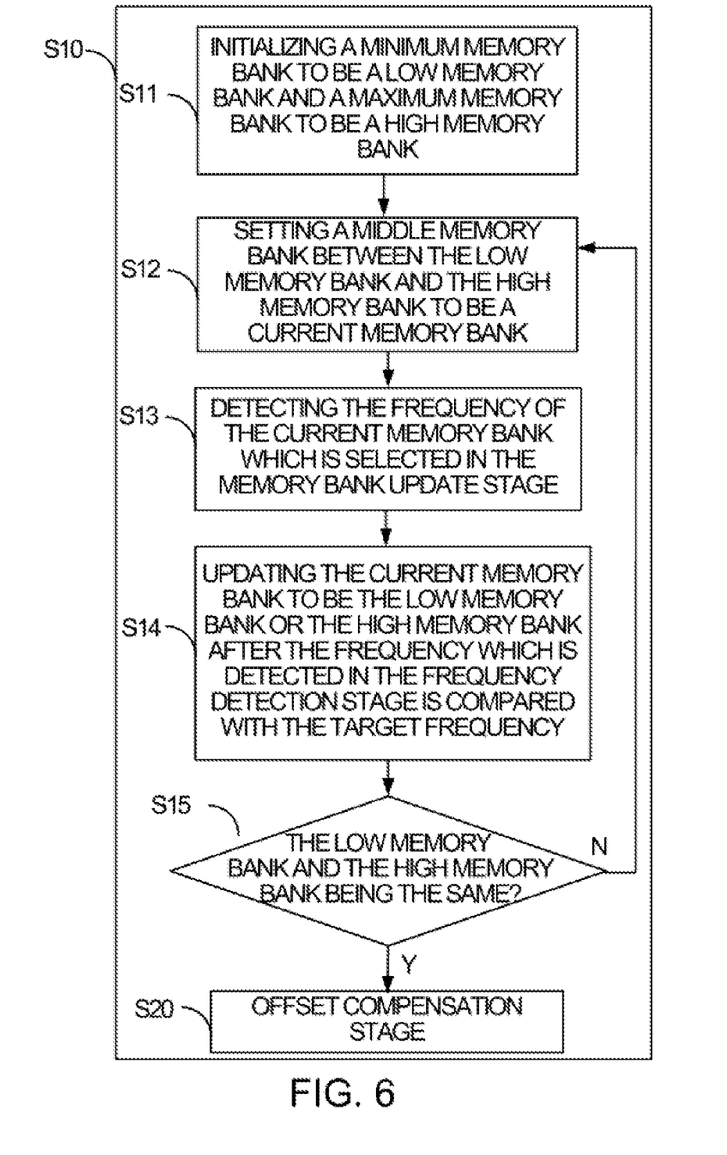
FIG. 6 illustrates a detailed flow chart of the open loop calibration processes.

Please refer to FIG. 6, which illustrates a detailed flow chart of the open loop calibration processes. As shown in FIG. 6, in an initialization stage S11, parameters for selecting the memory bank are initialized. The initialization stage S11 is set as the following: low memory bank (LowBank)=minimum memory bank (MINBANK), high memory bank (HighBank)=maximum memory bank (MAXBANK), compensation parameter (com_mag)=0, previous count value (Ncount_pre)=maximum count value (MAX NCOUNT) or minimum count value (MIN NCOUNT).

The low memory bank (LowBank) and the high memory bank (HighBank) the parameters for searching the memory bank. The minimum memory bank refers to a memory bank selection number which has a minimum capacity. The maximum memory bank refers to a memory bank selection number which has a maximum capacity. The present invention selects the GND mode or the VDD mode in the open loop status, and thus the previous count value (Ncount_pre)=maximum count value (MAX COUNT) in the GND mode and the previous count value (Ncount_pre)=minimum count value (MIN COUNT) in the VDD mode. The maximum count value or the minimum count value refers to a maximum count value or a minimum count value which the N counter permits in an interval of counting frequencies.

As described above, the parameters are initialized to set an initial value of the previous count value according to the GND mode or the VDD mode in the initialization stage S11.

Then, the open loop control signal which is outputted by the memory bank selector 11 is inputted to the up/down processor 100, and the open loop control processes are performed. The first and second multiplexers 110, 120 choose and output the GND mode or the VDD mode control signal to the charge pump 3. The charge bump pump 3 outputs the GND voltage or the VDD voltage to the VCO 6 via the loop filter 5 according to the corresponding mode.

The VCO 6 controls and outputs the oscillation frequency according to the inputted control voltages (GND or VDD). The oscillation is controlled according to the memory bank which is selected from the VCO memory bank 7. After the memory bank is selected and set, the open loop calibration process is ending. Then, the close loop control is proceeded for performing the frequency locked function.

After the parameters are set in the initialization stage S11, the current memory bank (BANK)={low memory bank (LowBank)+high memory bank (HighBank)/2} in the memory bank update stage S12, that is, a current memory bank is selected from a middle memory bank which can be set between the minimum memory bank and the maximum memory bank. When the current memory bank cannot be exactly set in the middle between the minimum memory bank and the maximum memory bank, a rounding operation is performed according to a rounding mode. When a difference between the low memory bank and the high memory bank is 1, the current memory bank, the minimum memory bank, and the maximum memory bank are respectively subtracted by 1 and then updated according to a verifying direction of the memory bank.

In a frequency detection stage S13, the frequency of the current memory bank which is selected in the memory bank update stage S12 is oscillated and detected.

In the frequency detection stage S13, the N counter serves as an exemplary of the frequency comparator 10. The N counter counts a count value for a predetermined interval, the corresponding count value serves as the frequency of the current memory bank, and the frequency of the current memory bank is detected. In the following embodiment, the N counter serves as the frequency comparator 10, and a situation of counting frequencies will be describe as the following.

In a memory bank verifying stage S14, the VCO 6 controls the oscillation frequency of the memory bank which is selected in the memory bank update stage S12 and outputs a frequency to be the current frequency, the frequency comparator 10 compares the current frequency with the target frequency so as to control the selection of the memory bank.

The N counter which serves as the frequency comparator 10 counts the frequencies in the predetermined interval, and compares the target frequency with the N count value which is set in advance.

In the memory bank verifying stage S14, when the current count value (Ncount) is greater than the target count value (Ntarget), the low memory bank (LowBank) is set to be the current memory bank (BANK); when the current count value (Ncount) is less than or equal to the target count value (Ntarget), the high memory bank (HighBank) is set to be the current memory bank (BANK).

In an open loop calibration determining stage S15, after the current memory bank is updated to be the low memory or the high memory bank by comparing the low memory bank with the high memory bank in the memory bank verifying stage S14, the low memory bank is compared with the high memory bank. When the low memory bank is the same as the high memory bank, the open loop calibration is ending. When the low memory bank is different from the high memory bank, the step is returned to the memory bank update stage S12 to update the memory bank and the count value is compared.

In the open loop calibration stage S10, the middle memory bank between the minimum memory bank and the maximum memory bank is initially selected to be the current memory bank, and the current count value is compared with the target count value. When the current count value is greater than the target count value, the current memory bank is updated to be the low memory bank. When the current count value is less than or equal to the target count value, the current memory bank is updated to be the high memory bank. Then, that whether the low memory bank is the same as or different from the high memory bank is determined. When the low memory bank is different from the high memory bank, a middle memory bank between the low memory bank which is updated and the high memory bank which is updated is reselected and the above-mentioned stages are performed repeatedly. When the low memory bank is the same as the high memory bank, the open loop calibration process is ending.

Figure 7:
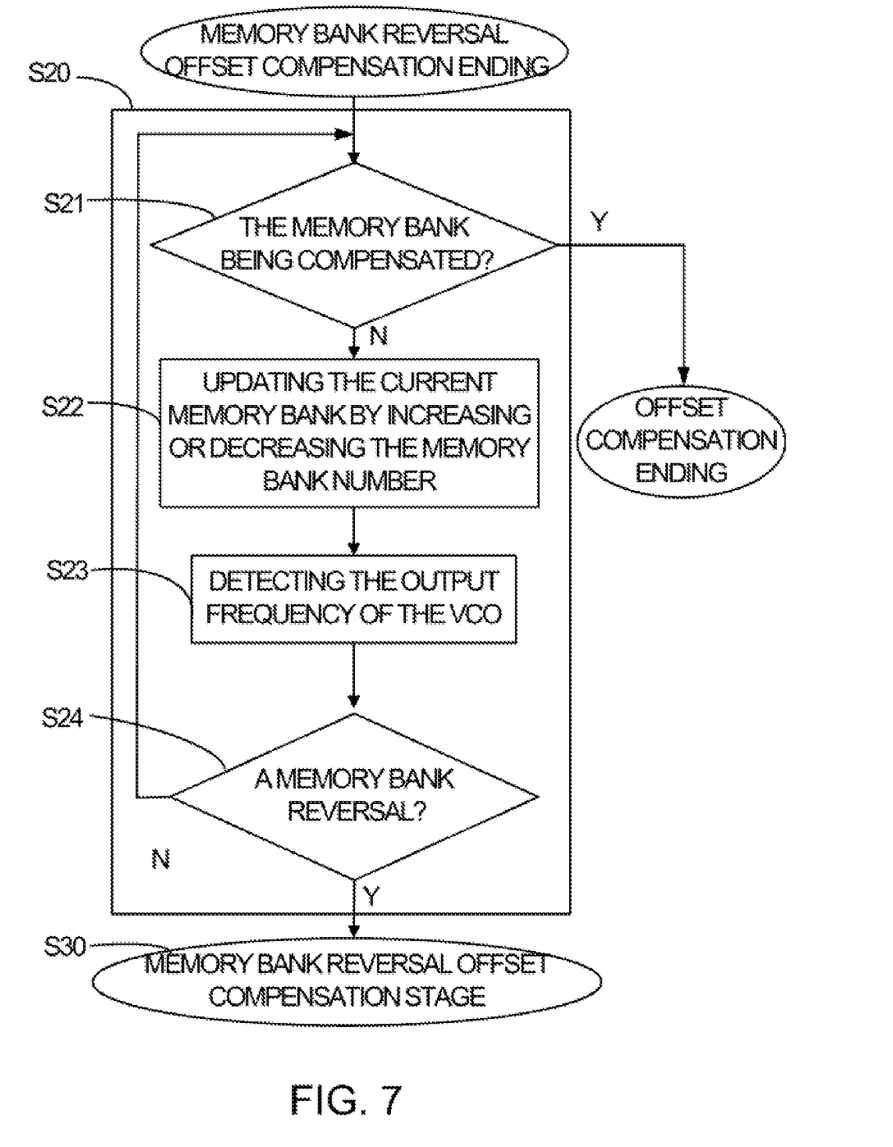
FIG. 7 illustrates a detailed flow chart of the offset compensation processes according to the present invention.

After the open loop calibration stage S10 is ending, the offset compensation stage S20 is required to be performed. Since the voltage which is inputted to the VCO 6 is the GND voltage or the VDD voltage according to the GND mode or the VDD mode, the offset which is set is required to be compensated.

The memory banks (BANK) in the VCO memory bank are inversely proportional to the frequencies (Freq). As shown in FIG. 4, the memory banks are arranged in sequence according to the capacities of the memory banks, and the memory banks are inversely proportional to the frequencies. That is, the minimum memory bank, such as BANK 1, has a maximum frequency, and the maximum memory bank has a minimum frequency. The capacities of the memory banks are inversely proportional to the frequencies.

If the target frequency is assumed to be f1, the memory bank which is close to the target frequency is selected when the open loop calibration stage S10 is performed. However, when the GND voltage or the VDD voltage serves as the control voltage in a practical situation of the close loop, the frequency cannot be locked steadily. Therefore, when the open loop is transformed to the close loop, the Vcp is required to be modified as a middle value between the GND voltage and the VDD voltage. A memory bank difference exists between the open loop and the control loop, and the memory bank difference is called as a Vcp offset.

Accordingly, the Vcp offset is compensated in the present invention so as to perform the frequency locked function in the close loop.

Figure 9:
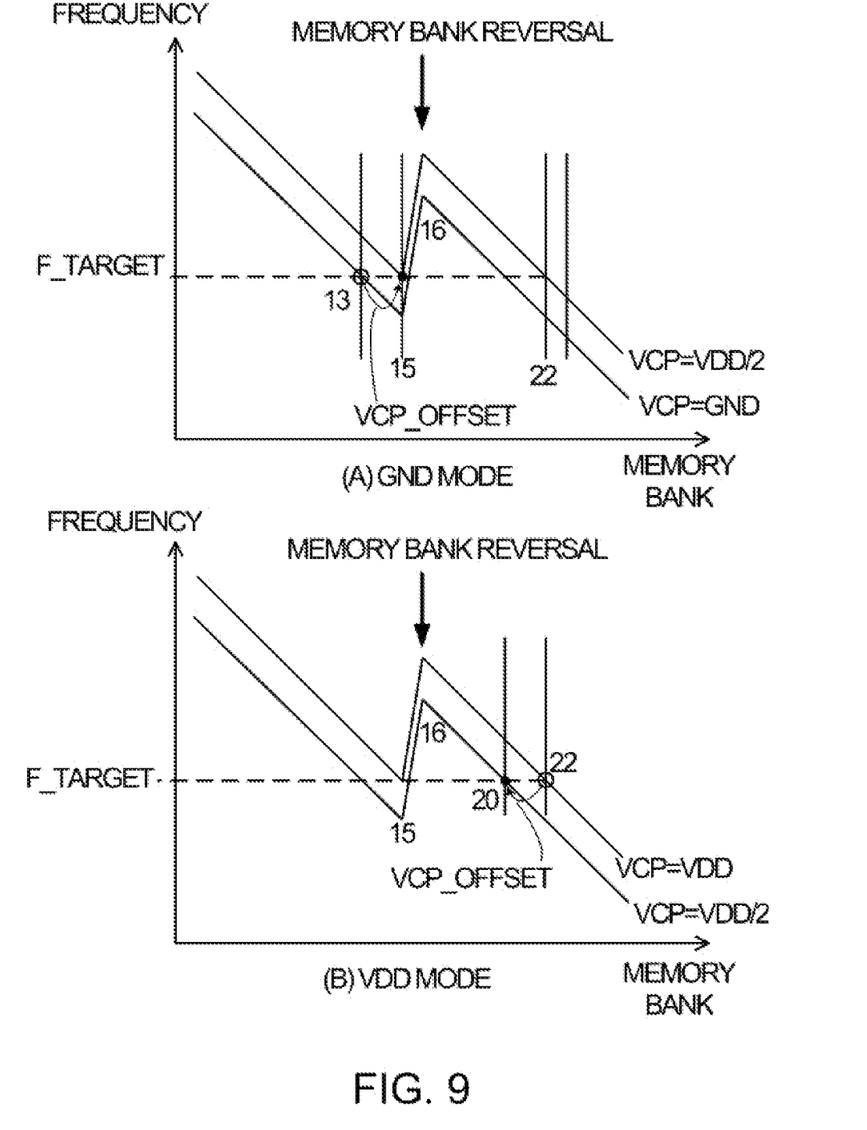
FIG. 9(a) and FIG. 9(b) illustrate the offset compensation in the GND mode and in the VDD mode.

Please refer to FIG. 9(*a*) and FIG. 9(*b*). FIG. 9(*a*) illustrates the offset compensation in the GND mode. FIG. 9(*b*) illustrates the offset compensation in the VDD mode.

In the GND mode, the offset compensation is implemented forward the direction of increasing memory bank numbers. In the VDD mode, the offset compensation is implemented forward the direction of decreasing memory bank numbers. Compared with a waveform of the reference voltage Vref, a probability of the same memory bank is low in the GND mode, and thus the memory bank number is increased in the offset compensation of the GND mode; a probability of the same memory bank is high in the VDD mode, and thus the memory bank number is decreased in the offset compensation of the VDD mode.

Please refer to FIG. 7, which illustrates a detailed flow chart of the offset compensation processes according to the present invention. The offset compensation stage S20 is described as the following. An offset compensation determining stage S21 determines that whether the Vcp offset of the memory bank is updated. In an initialization status, a value of the offset compensation (comp_mag) is updated, and the value of the offset compensation is compared with the value of the Vcp offset (VCP_OFFSET) which is set. When the value of the offset compensation (comp_mag) is the same as the value of the Vcp offset (VCP_OFFSET), the offset compensation stage S20 is ending. When the value of the offset compensation (comp_mag) is different from the value of the Vcp offset value (VCP_OFFSET), the memory bank is updated via the following stages.

In the offset compensation determining stage S21, when the value of the offset compensation is different from the value of the Vcp offset, a memory bank update stage S22 where the memory bank is updated is performed. In the memory bank update stage S22 as shown in the GND mode of FIG. 9(a) or in the VDD mode of FIG. 9(b), the memory bank numbers are increased as shown in the GND mode of FIG. 9(a) or decreased as shown in the VDD mode of FIG. 9(b).

After the memory bank update stage S22 is performed, a memory bank reversal determining stage S24 where the previous count value is compared with the current count value is performed. When the memory bank reversal does not occur, returning to the offset compensation determining stage S21. When the memory bank reversal occurs, a memory bank reversal offset compensation stage S30 is performed.

In the memory bank reversal determining stage S24, when the previous count value (Ncount) is less than the current count value (Ncount) in the GND mode, it is determined that the memory bank reversal occurs. When the previous count value (Ncount) is greater than the current count value (Ncount) in the VDD mode, it is determined that the memory bank reversal occurs.

Accordingly, when the memory bank reversal does not occur, the memory bank numbers are updated with the offset which is set, the memory bank which is compensated is set to be an ending memory bank in the open loop calibration, and the open loop control is ending. When the memory bank reversal occurs, the memory bank reversal offset compensation stage S30 is performed. After the memory bank reversal offset compensation is performed so that the final offset compensation is ending, the process of setting the memory bank is proceeded in the open loop.

Figure 10:
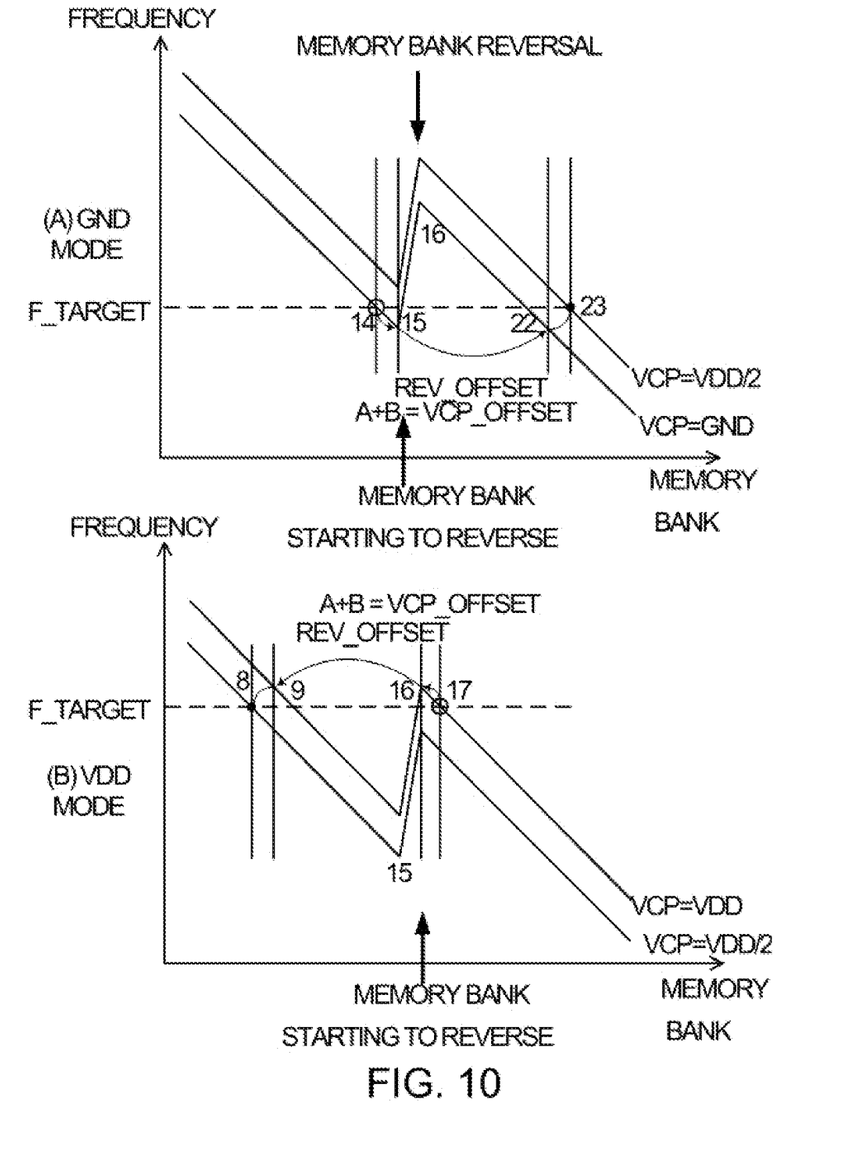
FIG. 10(a) and FIG. 10(b) illustrate the memory bank reversal offset compensation in the GND mode and in the VDD mode.

The memory bank reversals are shown in FIGS. 10(a) and 10(b). Since the memory banks are arranged according to the capacities of the memory banks, the frequencies and the memory bank numbers are inversely proportional. However, due to stray capacitance or other problems of manufacturers, the memory bank reversal where the frequencies are not inversely proportional the memory bank numbers occurs.

For instance, FIG. 10(a) illustrates the memory bank reversal offset compensation in the GND mode. When the memory bank 15 is compared with the memory bank 16, the frequency of the memory bank 16 is greater than the frequency of the memory bank 15 in the process of decreasing frequency. This is called as the memory bank reversal.

Accordingly, the memory bank 14 should have perform the offset compensation stage S20, so that the value of the offset compensation=2 and the current memory bank is set to be the memory bank 16. However, the frequency of the memory bank 16 and the target frequency have a great frequency difference under this situation. Therefore, to prevent an error resulted from the memory bank reversal, the present invention further performs the memory bank reversal offset compensation S30 as shown in FIG. 8.

Figure 8:
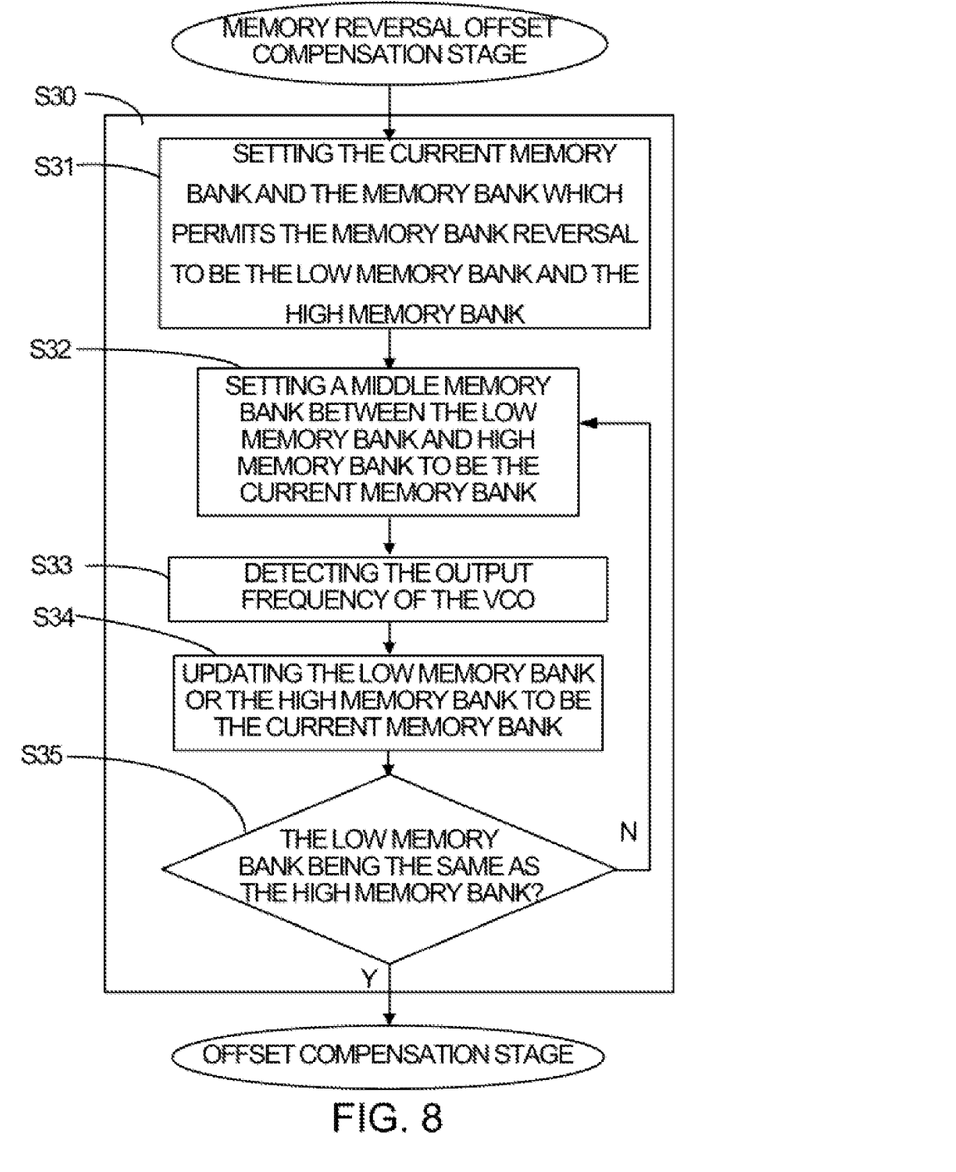
FIG. 8 illustrates a flow chart of the memory bank reversal offset compensation processes according to the present invention.

Please refer to FIG. 8, which illustrates a flow chart of the memory bank reversal offset compensation processes according to the present invention. The memory bank reversal compensation stage comprises the following stages. In a memory bank reversal offset compensation initialization stage S31, the current memory bank and the memory bank which permits the memory bank reversal are respectively set to be the low memory bank and the high memory bank.

In a memory bank update stage S32, the current memory bank (BANK={LowBank+HighBank}/2) is set to be a middle memory bank between the low memory bank and the high memory bank.

In a frequency detection stage S33, after the current memory bank is set and the corresponding memory bank is selected, the output frequency of the VCO is detected.

In a memory bank verifying stage S34, the current frequency which is detected in the frequency stage S33 is compared with the frequency of the memory bank where the memory bank reversal occurs, and the current memory bank is set to be the low memory bank or the high memory bank.

After the memory bank verifying stage S34 is ending, that whether the low memory bank is the same as the high memory bank is determined in a memory bank reversal offset compensation determining stage S35. When the low memory bank is the same as the high memory bank, the memory bank reversal offset compensation is ending, returning to the offset compensation stage S20. When the low memory bank is different from the high memory bank, returning to the memory bank update stage S32 and repeating the stages S33-S35.

Firstly, when the memory bank reversal occurs, the memory bank reversal offset compensation initialization stage S31 is performed to initialize the parameters for the memory bank reversal offset compensation.

In the GND mode, the parameters are initialized as: the high memory bank (HighBank)=the current memory bank (BANK)+a value of offset search (off_search_mg), and the low memory bank (LowBank)=the current memory bank (BANK).

In the VDD mode, the parameters are initialized as: the high memory bank (HighBank)=the current memory bank (BANK), and the low memory bank (LowBank)=the current memory bank+the value of offset search (off_search_mg). The value of offset search (off_search_mg) refers to a maximum memory bank range for permitting the memory bank reversal occurrence. The maximum memory bank range is a constant which is set in advance. When the memory bank reversal occurs beyond the maximum memory bank range, it is the problem of the product per se.

Furthermore, a memory bank which starts to reverse (RevStartBank) is set.

Then, in the memory bank update stage S32, the middle memory bank between the low memory bank and the high memory bank in the memory reversal offset initialization stage S31 is set to be the current memory bank. When the current memory bank cannot be exactly set in the middle between the minimum memory bank and the maximum memory bank {BANK={LowBank+HighBank}/2}, a rounding operation is performed according to a rounding mode. When a difference between the low memory bank and the high memory bank is 1, the current memory bank, the minimum memory bank, and the maximum memory bank are respectively subtracted by 1 and then updated according to a verifying direction of the memory bank.

After the current memory bank is set, the frequency detection stage S33 is performed. In the frequency detection stage S33, the current frequency which is generated by the VCO is detected after the corresponding memory bank is selected. The N counter which serves as the frequency comparator 10 counts the frequencies for detecting the frequency.

After the frequency detection stage S33 is ending, the memory bank verifying stage S34 is performed. In the memory bank verifying stage S34, the current frequency is compared with the frequency of the memory bank which starts to reverse, and then the high memory bank and the low memory bank are updated.

When the current count value (Ncount) is greater than the target count value (Ntarget), the current memory bank (BANK) is set to be the low memory bank (LowBank). When the current count value (Ncount) is less than the target count value (Ntarget), the current memory bank (BANK) is set to be the high memory bank (HighBank) (that is, HighBank=BANK).

After the memory bank verifying stage S34 is ending, the memory bank reversal offset compensation determining stage S35 is performed to determine whether the low memory bank is the same as the high memory bank. When the low memory bank is the same as the high memory bank, the memory bank reversal offset compensation is ending, and returning to the offset compensation stage S20. When the low memory bank is the same as the high memory bank are different, returning to the memory bank update stage S32 and repeating the stages S33-S35.

After the memory bank reversal offset compensation stage S30 is performed as mentioned-above and the Vcp offset compensation is performed for updating the value of the offset compensation, the final memory bank which is compensated is determined.

FIG. 10(a) illustrates the memory bank reversal offset compensation processes in the GND mode. The memory bank 14 corresponding to the target frequency is found in the open loop calibration stage S10, and the memory bank 14 performs the offset compensation stage S20. The current memory bank is updated from the memory bank 14 to the memory bank 15. Then, when the current memory bank is updated form the memory bank 15 to the memory bank 16, the frequency is increased significantly and thus the memory bank reversal occurs.

Accordingly, when the current memory bank is updated from the memory bank 15 to the memory bank 16, the memory bank reversal is determined and thus the memory bank reversal offset compensation stage S30 is performed. In the memory bank reversal offset compensation stage S30, a memory bank having the same count value as the memory bank which starts to reverse (RevStartBank) is found. Therefore, as shown in FIG. 10(a), the memory bank 22 having the same count value as the memory bank 15 which starts to reverse is found. When the memory bank 22 is found, returning to the offset compensation stage S20 for compensating another value of offset compensation. Since the memory bank 23 is the same as the target frequency, the memory bank 23 is set to be an ending offset compensation memory bank and the open loop is ending.

FIG. 10(b) illustrates the memory bank reversal offset compensation processes in the VDD mode. The memory bank 17 corresponding to the target frequency is found in the open loop calibration stage S10, and the memory bank 16 performs the offset compensation stage S20. In the offset compensation stage S20, the current memory bank is updated from the memory bank 17 to the memory bank 16 (offset b). When the current memory bank is updated from the memory bank 16 to the memory bank 15, the frequency is decreased significantly and thus the memory bank reversal occurs.

Accordingly, as shown in FIG. 10(b), the memory bank 9 which has the same count value as the memory bank 16 which starts to reverse is found. When the memory bank 9 is found, returning to the offset compensation stage S20 for compensating another value a of offset compensation so that the memory bank 8 is the same as the target frequency. Thus, the memory bank 8 is set to be an ending offset compensation memory bank and the open loop is ending.

As mentioned above, the present invention removes the loop switch which is utilized for inputting the Vref and utilizes the up/down processor to control the GND voltage or the VDD voltage to be the input of the charge pump, whereby a device for generating the Vref voltage is not required and the phase noise due to the loop switch can be avoided.

Furthermore, the present invention performs the offset compensation by the GND mode or the VDD mode in the open loop control so as to implement the frequency locked function.

In addition, to solve a wrong determining of the memory bank reversal resulted from a memory bank capacity error in manufacturing processes of the memory bank, the memory bank reversal offset compensation is performed when the memory bank reversal occurs, whereby the memory bank capacity error between the designed memory bank capacity and the practical memory bank capacity can be avoided. Accordingly, errors of selecting the memory bank can be decreased, and the frequency locked function can be implemented faster.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. An apparatus for frequency calibration in a frequency synthesizer, the frequency synthesizer comprising a phase detector for detecting a phase difference between a phase of an input frequency and a phase of a feedback frequency being fed back by a programmable divider, and a charge pump for generating and outputting one of a step-up voltage and a step-down voltage to a voltage-controlled oscillator via a loop filter, the apparatus for frequency calibration in the frequency synthesizer comprising:

a frequency comparator, comparing a current frequency with a target frequency while the programmable divider feeds an output frequency of the voltage-controlled oscillator back to the phase detector;

a memory bank selector, selecting a voltage-controlled oscillator memory bank of the voltage-controlled oscillator to reach the target frequency; and an up/down processor disposed between the phase detector and the charge pump, the up/down processor controlling the charge pump to output one of a GND voltage and a VDD voltage in an open loop status, and to output one of the step-up voltage and the step-down voltage in a close loop status according to the phase difference, wherein a value of the memory bank which is selected by the memory bank selector in the open loop status is added to an offset to determine a final value of the voltage-controlled oscillator memory bank.

2. The apparatus for frequency calibration in the frequency synthesizer of claim 1, wherein the up/down processor comprises:

a first multiplexer, selecting either a GND/VDD mode control signal in the open loop status or a first up control signal which is varied with the phase difference of the phase detector to be a second up control signal according to an open loop control signal of the memory bank selector, and outputting the second up control signal to the charge pump; and a second multiplexer, selecting either the GND/VDD mode control signal in the open loop status or a first down control signal which is varied with the phase difference of the phase detector to be a second down control signal according to the open loop control signal of the memory bank selector, and outputting the second down control signal to the charge pump, wherein the GND voltage or the VDD voltage is selected to be a control voltage of the voltage-controlled oscillator and outputted by the voltage-controlled oscillator when the mode control signal is inputted to the charge pump.

3. A method for frequency calibration in a frequency synthesizer, a GND voltage or a VDD voltage being inputted to a voltage-controlled oscillator in an open loop status, a memory bank in a voltage-controlled oscillator memory bank being selected after a current frequency outputted by the voltage-controlled oscillator is compared with a target frequency, the method comprising steps of:

comparing the current frequency outputted by the voltage-controlled oscillator with the target frequency, updating the memory bank of the voltage-controlled oscillator memory bank, and selecting a memory bank whose frequency is close to the target frequency in an open loop calibration stage;

compensating the memory bank being selected in the open loop calibration stage with an offset in an offset compensation stage; and comparing the current frequency being updated in the offset compensating stage with a previous frequency to determine whether the memory bank reversal occurs in a memory bank reversal offset compensation stage;

updating and compensating the memory bank until finding another memory bank where a next memory bank reversal occurs when the memory bank reversal occurs in a memory bank offset compensation stage, wherein the another memory bank and the memory bank having the same frequency; and returning to the offset compensation stage after the memory bank reversal offset is compensated.

4. The method for frequency calibration in the frequency synthesizer of claim 3, wherein the open loop calibration stage comprises steps of:

initializing a minimum memory bank to be a low memory bank and a maximum memory bank to be a high memory bank in an initialization stage;

setting a middle memory bank between the low memory bank and the high memory bank to be a current memory bank in a memory bank update stage;

detecting the frequency of the current memory bank which is selected in the memory bank update stage in a frequency detection stage;

updating the current memory bank to be the low memory bank or the high memory bank after the frequency which is detected in the frequency detection stage is compared with the target frequency in a memory bank verifying stage;

determining whether the low memory bank and the high memory bank are the same by comparing the low memory bank with the high memory bank in an open loop calibration determining stage;

the open loop calibration stage being ending when the low memory bank and the high memory bank are the same; and returning to the memory bank update stage when the low memory bank and the high memory bank are different.

5. The method for frequency calibration in the frequency synthesizer of claim 3, wherein the offset compensation stage comprises steps of:

determining whether the memory bank which is selected in the open loop calibration stage is compensated with the offset in an offset compensation determining stage;

updating the current memory bank by increasing the memory bank number in the GND mode or decreasing the memory bank number in the VDD mode when the offset compensation stage is not ending in a memory bank update stage;

detecting the output frequency of the voltage-controlled oscillator after the memory bank which is updated in the memory bank update stage is selected to be the current memory bank in a frequency detection stage;

determining whether a memory bank reversal occurs by comparing the frequency of the previous memory bank with the frequency of the current memory bank in a memory bank reversal determining stage;

returning to the offset compensation determining stage when the memory bank reversal does not occur; and performing the memory bank reversal offset compensation stage when the memory bank reversal occurs.

6. The method for frequency calibration in the frequency synthesizer of claim 3, wherein the memory bank reversal offset compensation comprises steps of:

setting the current memory bank and the memory bank which permits the memory bank reversal to be the low memory bank and the high memory bank in a memory bank reversal offset compensation initialization stage;

setting a middle memory bank between the low memory bank and high memory bank to be the current memory bank in a memory bank update stage;

detecting the output frequency of the voltage-controlled oscillator after the current memory bank is set and the corresponding memory bank is selected in a frequency detection stage;

updating the low memory bank or the high memory bank to be the current memory bank after the current frequency which is detected in the frequency detection stage is compared with the frequency of the memory bank where the memory bank reversal occurs in a memory bank verifying stage; and determining whether the low memory bank is the same as the high memory bank in a memory bank reversal offset compensation determining stage;

the memory bank reversal offset compensation being ending and returning to the offset compensation stage when the low memory bank is the same as the high memory bank; and returning to the memory bank update stage and performing repeatedly from the memory bank update stage to the memory bank reversal offset compensation stage when the low memory bank is different from the high memory bank.

* * * * *